(12) United States Patent
Lu et al.

(10) Patent No.: US 11,024,702 B2
(45) Date of Patent: Jun. 1, 2021

(54) STACKED ELECTRONIC STRUCTURE

(71) Applicant: CYNTEC CO., LTD., Hsinchu (TW)

(72) Inventors: Bau-Ru Lu, Changhua County (TW);
Jianhong Zeng, Shanghai (CN); Chun Hsien Lu, Hsinchu (TW)

(73) Assignee: CYNTEC CO., LTD., Hsinchu (TW)

(*) Notice: Subject to any disclaimer, the term of this patent is extended or adjusted under 35 U.S.C. 154(b) by 0 days.

(21) Appl. No.: 16/690,148

(22) Filed: Nov. 21, 2019

(65) Prior Publication Data

US 2020/0286980 A1   Sep. 10, 2020

Related U.S. Application Data

(60) Provisional application No. 62/822,051, filed on Mar. 22, 2019, provisional application No. 62/813,161, filed on Mar. 4, 2019.

(51) Int. Cl.
| | |
|---|---|
| *H01L 49/02* | (2006.01) |
| *H05K 1/11* | (2006.01) |
| *H01L 23/00* | (2006.01) |
| *H01L 23/532* | (2006.01) |
| *H01L 23/31* | (2006.01) |
| *H01L 25/065* | (2006.01) |

(52) U.S. Cl.
CPC .............. *H01L 28/10* (2013.01); *H01L 23/31* (2013.01); *H01L 23/53228* (2013.01); *H01L 24/14* (2013.01); *H01L 25/0657* (2013.01); *H05K 1/11* (2013.01)

(58) Field of Classification Search
CPC ... H01L 28/10; H01L 23/31; H01L 23/53228; H01L 24/14; H01L 25/0657; H05K 1/11
See application file for complete search history.

(56) References Cited

U.S. PATENT DOCUMENTS

| 8,064,211 | B2* | 11/2011 | Furukawa | ............... | H01G 4/228 |
| | | | | | 361/760 |
| 2011/0147901 | A1* | 6/2011 | Huang | ............... | H01L 23/49811 |
| | | | | | 257/660 |
| 2011/0228507 | A1* | 9/2011 | Yin | .................. | H01L 23/49531 |
| | | | | | 361/811 |
| 2013/0001756 | A1* | 1/2013 | Chen | ....................... | H01L 25/16 |
| | | | | | 257/666 |
| 2018/0053755 | A1* | 2/2018 | Cho | .................. | H01L 23/49811 |

* cited by examiner

*Primary Examiner* — Peniel M Gumedzoe
(74) *Attorney, Agent, or Firm* — Min-Lee Teng; Litron Patent & Trademark Office

(57) ABSTRACT

A stacked electronic structure comprises: a substrate and a magnetic device, wherein electronic devices and conductive pillars are disposed on and electrically connected to the substrate, wherein a molding body encapsulates the electronic devices, and the magnetic device is disposed over and electrically connected to the conductive pillars, wherein at least one recess or groove can be formed on the bottom surface of the conductive pillar, such as copper pillar, to help the venting of the soldering material as well as to increase the soldering area.

20 Claims, 17 Drawing Sheets

STACKED ELECTRONIC STRUCTURE

CROSS-REFERENCES TO RELATED APPLICATIONS

The present application claims the benefit of U.S. Provisional Application Ser. No. 62/813,161 filed on Mar. 4, 2019 and 62/822,051 filed on Mar. 22, 2019, which are hereby incorporated by reference herein and made a part of the specification.

BACKGROUND OF THE INVENTION

I. Field of the Invention

The invention relates to stacked electronic structures.

II. Description of the Related Art

Electronic structures, such as power modules and DC-DC converters, typically include electronic devices, having interconnecting circuitry, electrically connected to a substrate. The devices are coupled to leads for connection to conductive patterns and/or other electronic assemblies.

One conventional approach for reducing the surface area occupied by the electronic structures in compact electronic products is to stack the assembled devices. For example, as shown in FIG. 1, an electronic structure 100 comprises a magnetic body 120 stacked over a PCB substrate 110, having electronic devices 112 therebetween. The magnetic body 120 is structurally supported by outer conductive leads 102 and 104, which are mounted to respective sides of the PCB substrate 110, which not only requires more surface area of the substrate for accommodating the leads 102, 104, but also increases the overall impedance caused by the leads 102, 104.

Accordingly, there is demand for a better stacked electronic structure to solve the aforementioned problems.

SUMMARY OF THE INVENTION

In one embodiment, a stacked electronic structure is disclosed, wherein the stacked electronic structure comprises: a substrate, wherein a plurality of electronic devices and a plurality of conductive pillars are disposed on and electrically connected to the substrate, wherein a molding body encapsulates the plurality of electronic devices, wherein at least one first recess is formed on a bottom surface of a first conductive pillar of the plurality of conductive pillars, and a soldering material is disposed on a top surface of the substrate and filled into said at least one first recess, and wherein at least one second recess is formed on a bottom surface of a second conductive pillar of the plurality of conductive pillars, and a soldering material is disposed on a top surface of the substrate and filled into said at least one second recess; and a magnetic device, disposed over the top surface of the molding body and the plurality of conductive pillars, wherein a first electrode of the magnetic device is disposed over and electrically connected to a first conductive pillar and a second electrode of the magnetic device is disposed over and electrically connected to a second conductive pillar.

In one embodiment, each of the first conductive pillar and the second conductive pillar is made of metal.

In one embodiment, each of the first conductive pillar and the second conductive pillar comprises a copper pillar.

In one embodiment, each of the first conductive pillar and the second conductive pillar is made of a copper pillar.

In one embodiment, a first plurality of recesses are formed on the bottom surface of the first conductive pillar, and the soldering material is disposed on the top surface of the substrate and filled into the first plurality of recesses.

In one embodiment, a second plurality of recesses are formed on the bottom surface of the second conductive pillar, and the soldering material is disposed on a top surface of the substrate and filled into the second plurality of recesses.

In one embodiment, the substrate is a printed circuit board (PCB).

In one embodiment, the magnetic device comprises an inductor.

In one embodiment, the magnetic device is an inductor.

In one embodiment, the magnetic device is an inductor, which can be a choke.

In one embodiment, the inductor comprises a magnetic body and a coil disposed in the magnetic body, wherein a first lead of the inductor is disposed on the magnetic body and electrically connected to the coil, wherein the first lead comprises a first portion disposed on a top surface of the magnetic body and a second portion extended disposed on a lateral surface of the magnetic body.

In one embodiment, the plurality of electronic devices comprise an IC and a MOSFET.

In one embodiment, the molding body further encapsulates the plurality of conductive pillars with a top surface of each of the conductive pillars exposed from the molding body.

In one embodiment, a metal layer encapsulates the plurality of electronic devices, wherein the molding body further encapsulates the plurality of conductive pillars and the metal layer, wherein a top surface of each of the conductive pillars and a top surface of the metal layer are exposed from the top surface of the molding body.

In one embodiment, the metal layer is a folded metal plate that covers a top surface and side surfaces of the plurality of electronic devices, wherein at least one portion of the molding body is disposed between the said metal layer and the plurality of electronic devices.

In one embodiment, a first metal layer encapsulates a top surface and a plurality of side surfaces of the magnetic device.

In one embodiment, the first metal layer is a folded metal plate that encapsulates the top surface and the plurality of side surfaces of the magnetic device.

In one embodiment, the first metal layer is a folded metal plate that encapsulates the top surface and the plurality of side surfaces of the inductor.

In one embodiment, the first metal layer is a folded metal plate that encapsulates the top surface and the plurality of side surfaces of the inductor.

In one embodiment, the first metal layer is electrode-plated on the top surface and the plurality of side surfaces of the inductor.

In one embodiment, a bottom surface of the first metal layer and a top surface of the second metal layer are joint by a soldering material.

In one embodiment, a bottom surface of the first metal layer and a top surface of the second metal layer are joint by a soldering material, and the second metal layer is electrically connected to a corresponding conductive pillar.

In one embodiment, a bottom surface of the first metal layer and a top surface of the second metal layer are joint by a conductive and adhesive material.

In one embodiment, a top surface of the first conductive pillar is lower than that of the molding body so that a third recess is formed on the top surface of the first conductive pillar with two sidewalls of the magnetic body, wherein the soldering material is filled into said third recess.

In one embodiment, a top surface of the first conductive pillar is higher than that of the molding body.

In one embodiment, the substrate is a BT (Bismaleimide Triazine) board, metallic substrate or ceramic substrate.

In one embodiment, the magnetic device is an inductor having a magnetic body, wherein the magnetic body is disposed over the top surface of the molding body, and the first and the second conductive pillars.

In one embodiment, each of the first conductive pillar and the second conductive pillar comprises copper pillar and at least one another metal that encapsulates the copper pillar, wherein at least one recess is formed in the at least one another metal.

In one embodiment, at least one first recess is formed on a first lateral surface of the first conductive pillar.

In one embodiment, at least one first recess is formed on a first lateral surface of the first conductive pillar and at least one cavity is formed on a second lateral surface of the first conductive pillar.

In one embodiment, at least one first protrusion is formed on a first lateral surface of the first conductive pillar.

In one embodiment, at least one first protrusion is formed on a first lateral surface of the first conductive pillar and at least one protrusion is formed on a second lateral surface of the first conductive pillar.

In one embodiment, the first electrode of the magnetic device is surface-mounted on the top surface of the first conductive pillar, and the second electrode of the magnetic device is surface-mounted on the top surface of the second conductive pillar.

In one embodiment, a stacked electronic structure is disclosed, wherein the stacked electronic structure comprises: a substrate, wherein a plurality of electronic devices and a plurality of conductive pillars are disposed on and electrically connected to the substrate, wherein a molding body encapsulates the plurality of electronic devices, wherein a first metal layer encapsulates the plurality of electronic devices, wherein a molding body encapsulates the plurality of conductive pillars and the first metal layer, wherein a top surface of each of the conductive pillars and a top surface of the first metal layer are exposed from the top surface of the molding body; and a magnetic device, disposed over the molding body, the metal layer and the plurality of conductive pillars, wherein a first electrode of the magnetic device is disposed over and electrically connected to a first conductive pillar and a second electrode of the magnetic device is disposed over and electrically connected to a second conductive pillar, wherein a second metal layer encapsulates a top surface and a plurality of side surfaces of the magnetic device, and the first metal layer is disposed over and electrically connected to the second metal layer.

In one embodiment, a stacked electronic structure is disclosed, wherein the stacked electronic structure comprises: a substrate, wherein a plurality of electronic devices and a plurality of conductive pillars are disposed on and electrically connected to the substrate, wherein a molding body encapsulates the plurality of electronic devices, wherein a metal layer encapsulates the plurality of electronic devices, wherein a molding body encapsulates the plurality of conductive pillars and the metal layer, wherein a top surface of each of the conductive pillars and a top surface of the metal layer are exposed from the top surface of the molding body; and a magnetic device, disposed over the molding body, the metal layer and the plurality of conductive pillars, wherein a first electrode of the magnetic device is disposed over and electrically connected to a first conductive pillar and a second electrode of the magnetic device is disposed over and electrically connected to a second conductive pillar, and wherein the metal layer is electrically connected to a third conductive pillar.

BRIEF DESCRIPTION OF THE DRAWINGS

The present invention can be more fully understood by reading the subsequent description and examples with references made to the accompanying drawings, wherein.

DETAILED DESCRIPTION OF THE INVENTION

Figure 1:
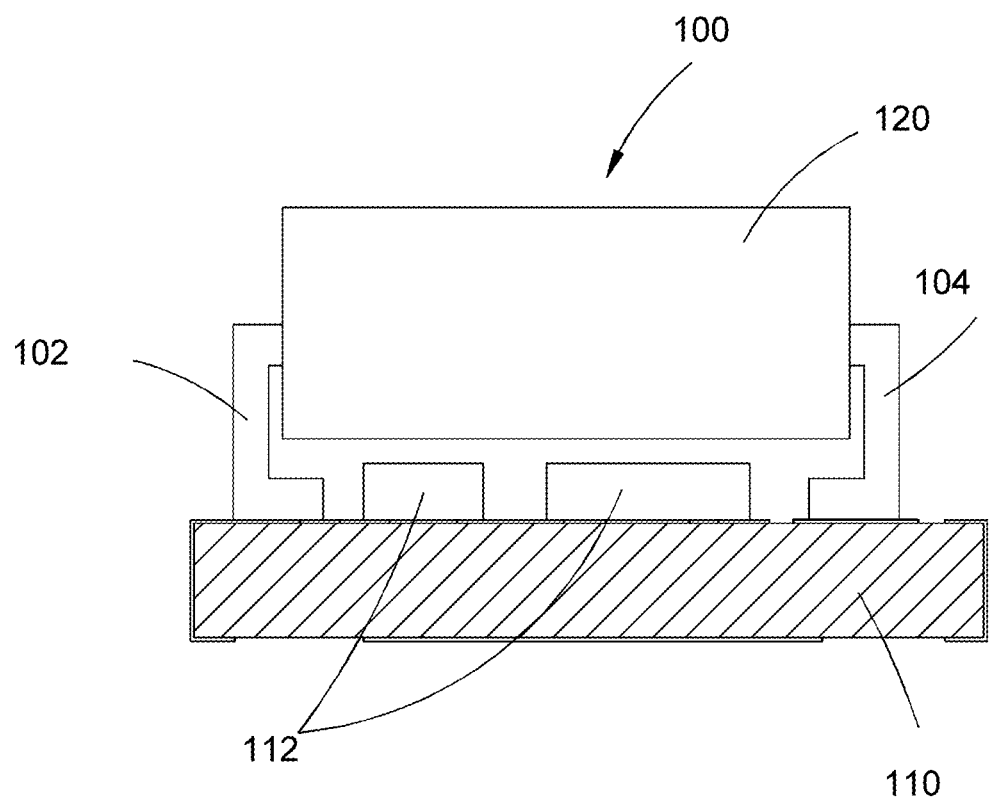
FIG. 1 is a partially schematic, cross-sectional side view of an electronic structure in accordance with the prior art.

It is understood that the following disclosure provides many different embodiments, or examples, for implementing different features of the invention. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features are formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2A:
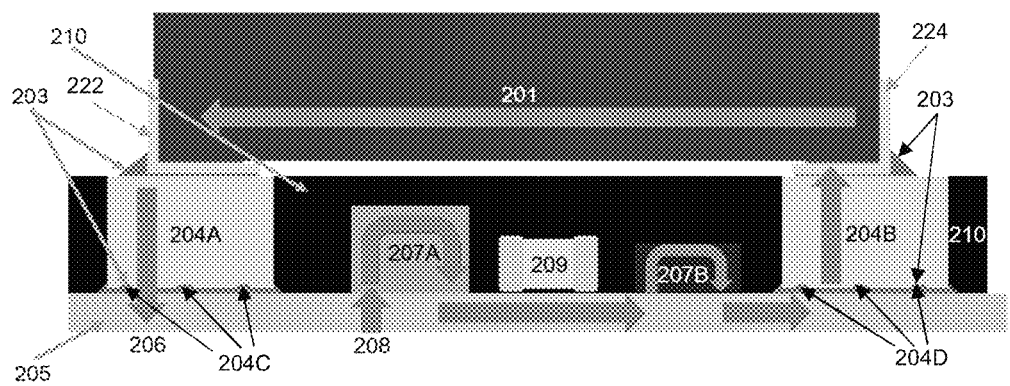
FIG. 2A-2Q each shows a partially schematic, cross-sectional side view of an electronic structure in accordance with a corresponding embodiment of the invention.

FIG. 2A is a partially schematic, cross-sectional side view of a stacked electronic structure in accordance with another embodiment of the invention. As shown in FIG. 2A, a stacked electronic structure includes a magnetic device 201, a plurality of electronic devices 207A, 207B, 209, and a substrate 205 having circuits therein, wherein electronic devices 207A, 207B can be active devices such as IC or MOSFET and the electronic device 209 can be a passive device such as a capacitor, resistor or an inductor. The magnetic device 201 comprises an inductor, which can be a choke. The substrate 205 can be a printed current board, BT board, metallic substrate or ceramic substrate and may be a two-layered or multi-layered substrate. The magnetic device 201 has first and second electrodes 222, 224, disposed on a first conductive pillar 204A and a second conductive pillar 204B, respectively. The top surface of the substrate 205 is disposed under the bottom surface of the magnetic device 201, and the first and second first conductive pillars 204A, 204B, respectively, are disposed therebetween. The first conductive pillar 204A comprises at least one first recess 204C that is formed on a bottom surface of the first conductive pillar 204A, and a soldering material 203 is disposed on a top surface of the substrate and filled into said at least one first recess 204C. The second conductive pillar 204B comprises at least one second recess 204D that is formed on a bottom surface of the second conductive pillar 204B, and a soldering material 203 is disposed on a top surface of the substrate 205 and filled into said at least one second recess 204D.

In one embodiment, the first and second first conductive pillars 204A, 204B, respectively, are disposed along two opposite edges of the substrate 205 and the magnetic device 201 is disposed thereon. Each of the plurality of electronic devices 207A, 207B, 209 can be active electronic components such as controller ICs, diodes or MOSFETs.

In one embodiment, as shown in FIG. 2A, a molding body 210 encapsulates the plurality of electronic devices 207A, 207B, 209 and the plurality of conductive pillars 204A, 204B with the top surface of each of the conductive pillars 204A, 204B exposed from the molding body 210. In one embodiment, the heat flow can be indicated from the arrow 208 to the arrow 206.

In one embodiment, the first electrode 222 of the magnetic device 201 is surface-mounted on the top surface of the first conductive pillar 204A, and the second electrode 224 of the magnetic device 201 is surface-mounted on the top surface of the second conductive pillar 204B.

In one embodiment, the first electrode 222 of the magnetic device 201 comprises a lead having a first portion disposed on a bottom surface of the inductor and a second portion disposed on a lateral surface of the inductor.

In one embodiment, the first electrode 222 of the magnetic device 201 comprises a lead having a first portion disposed on a top surface of the inductor and a second portion disposed on a lateral surface of the inductor.

In one embodiment, each of the first conductive pillar 204A and the second conductive pillar 204B is made of metal.

In one embodiment, each of the first conductive pillar 204A and the second conductive pillar 204B comprises copper pillar, and tin is plated on the top and the bottom surface of the copper pillar.

In one embodiment, each of the first conductive pillar 204A and the second conductive 204B pillar is made of copper.

In one embodiment, a first plurality of recesses 204C are formed on the bottom surface of the first conductive pillar 204A, and the soldering material 203 is disposed on the top surface of the substrate 205 and filled into the first plurality of recesses 204C.

In one embodiment, a second plurality of recesses 204D are formed on the bottom surface of the second conductive pillar 204B, and the soldering material 203 is disposed on a top surface of the substrate 205 and filled into the second plurality of recesses 204D.

In one embodiment, the inductor comprises a magnetic body and a coil disposed in the magnetic body, wherein a first lead of the inductor is disposed on the magnetic body and electrically connected to the coil, wherein the first lead comprises a first portion disposed on a top surface of the magnetic body and a second portion extended disposed on a lateral surface of the magnetic body.

In one embodiment, the molding body 210 further encapsulates the plurality of conductive pillars with a top surface of each of the conductive pillars exposed from the molding body 210.

At least one recess or groove formed at the bottom of the conductive pillar, such as a copper pillar, can help the venting of the solder paste and increase the soldering area for connecting the conductive pillar, such as a copper pillar, to the substrate 205 such as a PCB.

Figure 2B:
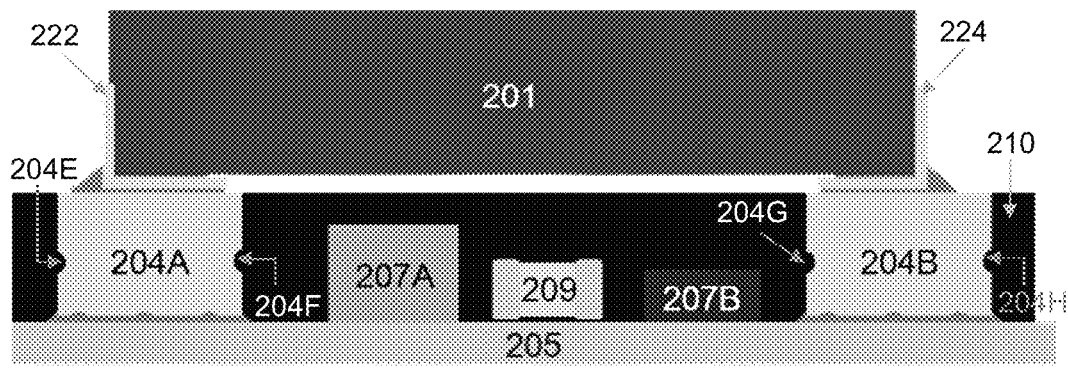

In one embodiment, as shown in FIG. 2B, a first recess 204E is formed in a first lateral surface of the first conductive pillar 204A. In one embodiment, a second recess 204F is formed in a second lateral surface of the first conductive pillar 204A.

In one embodiment, as shown in FIG. 2B, a third recess 204G is formed in a first lateral surface of the second conductive pillar 204B. In one embodiment, a fourth recess 204H is formed in a second lateral surface of the second conductive pillar 204B.

Figure 2C:
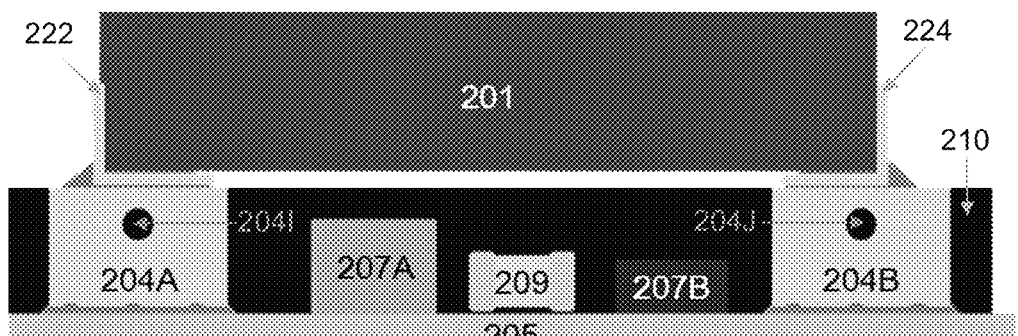

In one embodiment, as shown in FIG. 2C, a first cavity 204I is formed in a first lateral surface of the conductive pillar 204A. In one embodiment, a second cavity 204J is formed in a second lateral surface of the second conductive pillar 204B.

Figure 2D:
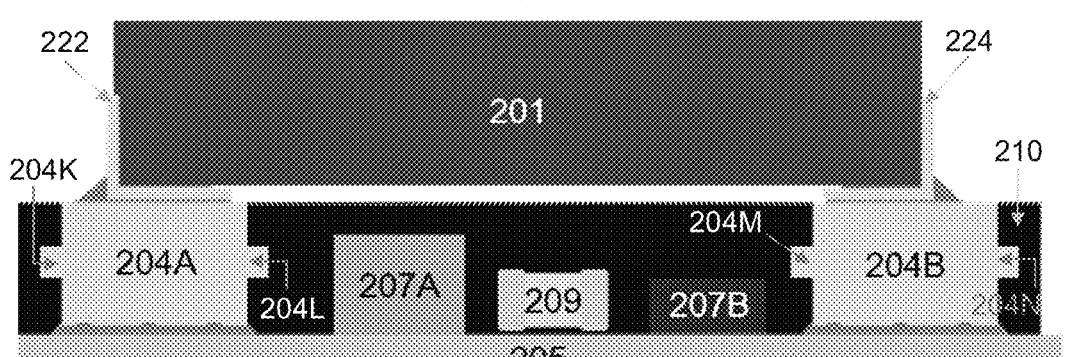

In one embodiment, as shown in FIG. 2D, a first protrusion 204K is formed on a first lateral surface of the first conductive pillar 204A. In one embodiment, a second protrusion 204L is formed on a second lateral surface of the first conductive pillar 204A.

In one embodiment, as shown in FIG. 2D, a third protrusion 204M is formed on a first lateral surface of the second conductive pillar 204B. In one embodiment, a fourth protrusion 204N is formed on a second lateral surface of the second conductive pillar 204B.

Figure 2E:
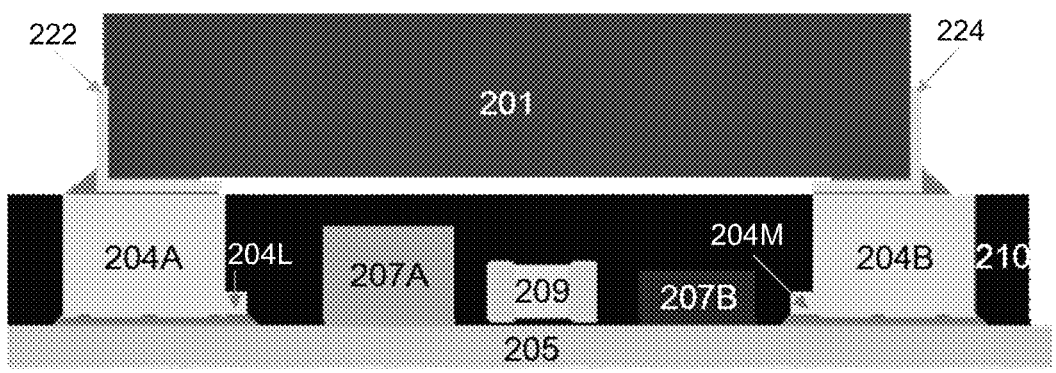

In one embodiment, as shown in FIG. 2E, a first protrusion 204L is formed on a first lateral surface of a first conductive pillar 204A and the bottom surface of the first protrusion 204L is aligned with the bottom surface of the first conductive pillar 204A. In one embodiment, a second protrusion 204M is formed on a second lateral surface of a second conductive pillar 204B, and the bottom surface of the second protrusion 204M is aligned with the bottom surface of the second conductive pillar 204B. In one embodiment, as shown in FIG. 2E, the first protrusion 204L and the second protrusion 204M are protruded inwardly.

Figure 2F:
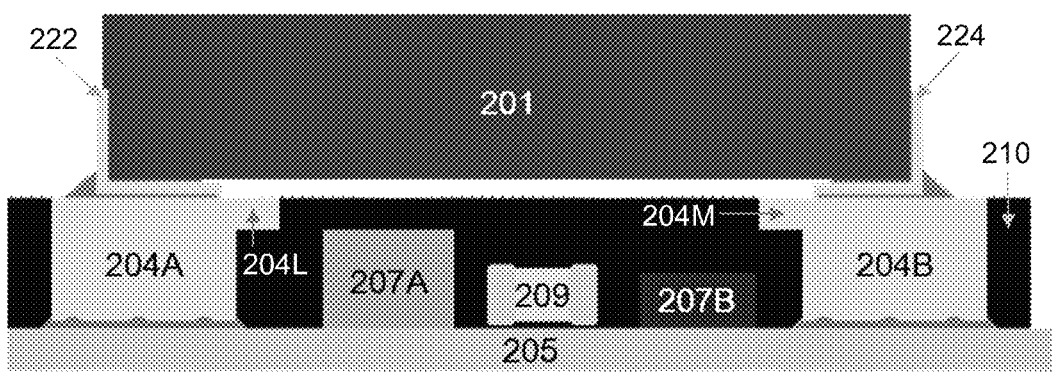

In one embodiment, as shown in FIG. 2F, a first protrusion 204L is formed on a first lateral surface of a first conductive pillar 204A and the top surface of the first protrusion 204L is aligned with the top surface of the first conductive pillar 204A. In one embodiment, a second protrusion 204M is formed on a second lateral surface of a second conductive pillar 204B, and the top surface of the second protrusion 204M is aligned with the top surface of the second conductive pillar 204B. In one embodiment, as shown in FIG. 2F, the first protrusion 204L and the second protrusion 204M are protruded inwardly.

Figure 2G:
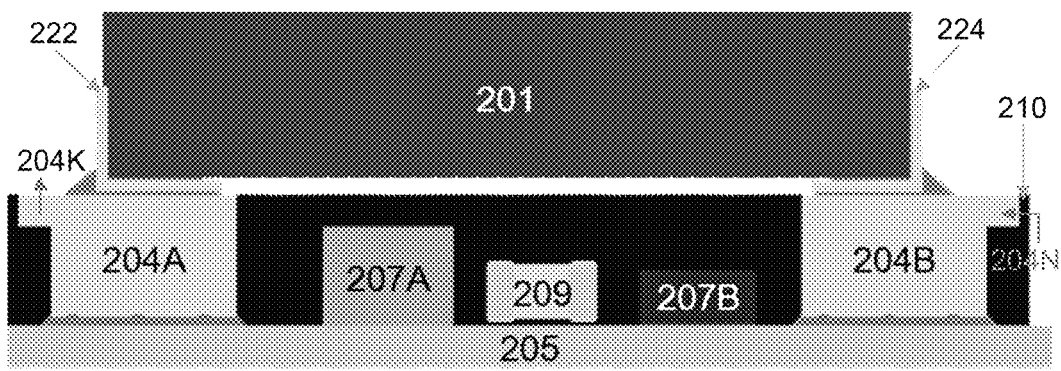

In one embodiment, as shown in FIG. 2G a first protrusion 204K is formed on a first lateral surface of a first conductive pillar 204A and the top surface of the first protrusion 204K is aligned with the top surface of the first conductive pillar 204A. In one embodiment, a second protrusion 204N is formed on a second lateral surface of a second conductive pillar 204B, and the top surface of the second protrusion 204N is aligned with the top surface of the second conductive pillar 204B. In one embodiment, as shown in FIG. 2G the first protrusion 204K and the second protrusion 204N are protruded outwardly.

Figure 2H:
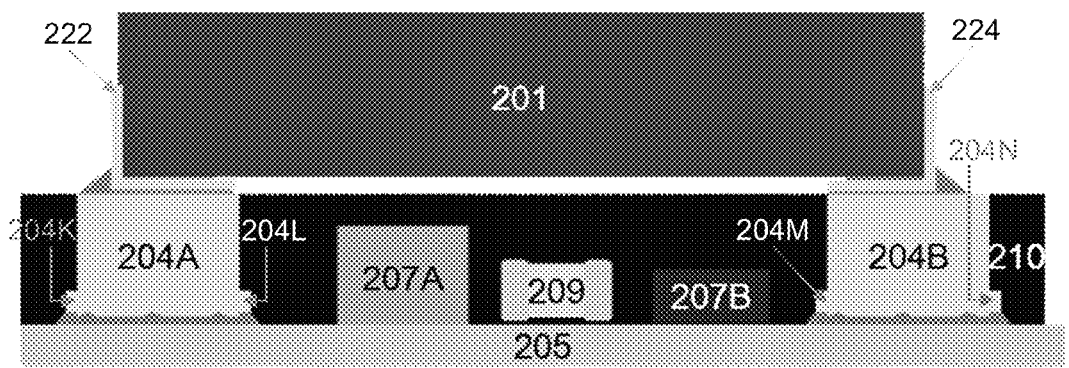

In one embodiment, as shown in FIG. 2H, a first protrusion 204K is formed on a first lateral surface of a first conductive pillar 204A and the bottom surface of the first protrusion 204K is aligned with the bottom surface of the first conductive pillar 204A; and a second protrusion 204L is formed on a second lateral surface of the first conductive pillar 204A, and the bottom surface of the second protrusion 204L is aligned with the bottom surface of the first conductive pillar 204A. In one embodiment, as shown in FIG. 2H, a third protrusion 204M is formed on a first lateral surface of a second conductive pillar 204B and the bottom surface of the third protrusion 204M is aligned with the bottom surface of the second conductive pillar 204B; and a fourth protrusion 204N is formed on a second lateral surface of the second conductive pillar 204B, and the bottom surface of the fourth protrusion 204N is aligned with the bottom surface of the second conductive pillar 204B.

Figure 2I:
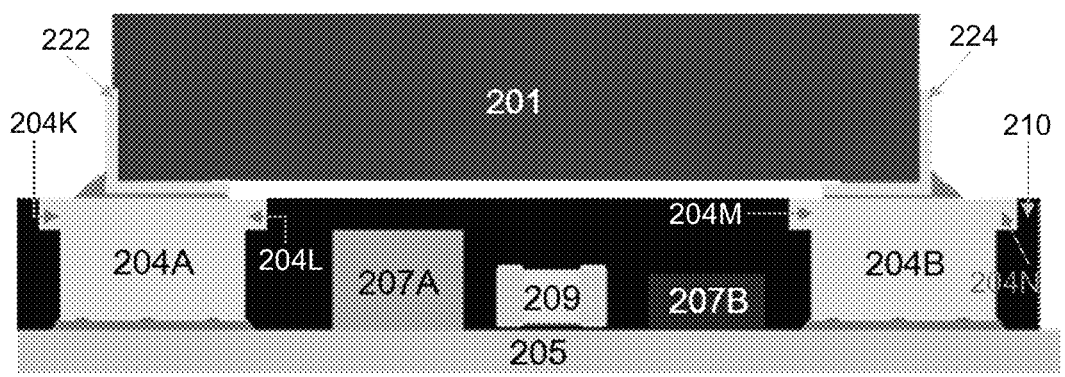

In one embodiment, as shown in FIG. 2I, a first protrusion 204K is formed on a first lateral surface of a first conductive pillar 204A and the top surface of the first protrusion 204K is aligned with the top surface of the first conductive pillar 204A; and a second protrusion 204L is formed on a second lateral surface of the first conductive pillar 204A, and the top surface of the second protrusion 204L is aligned with the top surface of the first conductive pillar 204A. In one embodiment, as shown in FIG. 2I, a third protrusion 204M is formed on a first lateral surface of a second conductive pillar 204B and the top surface of the third protrusion 204M is aligned with the top surface of the second conductive pillar 204B; and a fourth protrusion 204N is formed on a second lateral surface of the second conductive pillar 204B, and the top surface of the fourth protrusion 204N is aligned with the top surface of the second conductive pillar 204B.

Figure 2J:
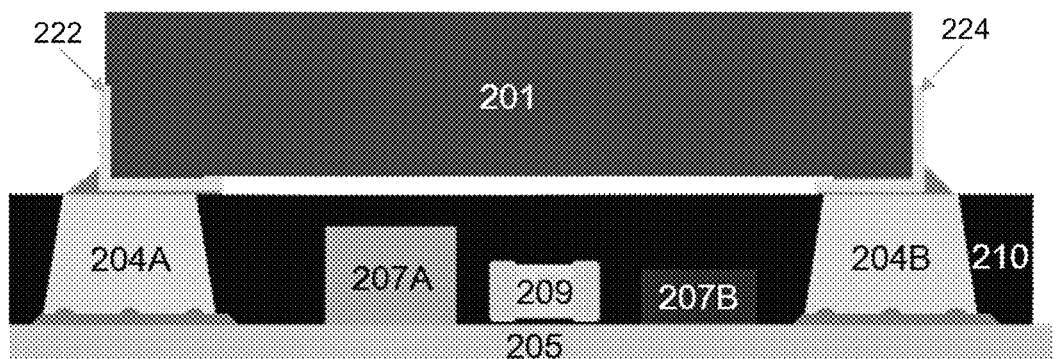

In one embodiment, as shown in FIG. 2J, the bottom surface of a first conductive pillar 204A is wider than the top surface of the first conductive pillar 204A. In one embodiment, as shown in FIG. 2J, the bottom surface of a second conductive pillar 204B is wider than the top surface of the second conductive pillar 204B.

Figure 2K:
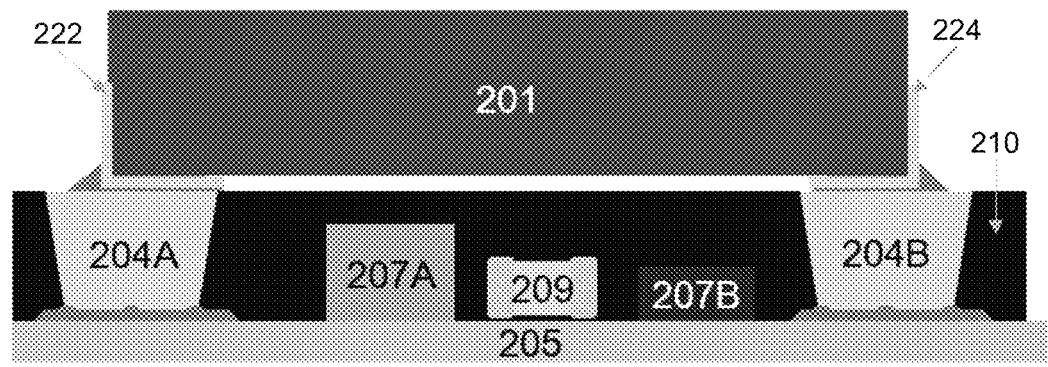

In one embodiment, as shown in FIG. 2K, the top surface of a first conductive pillar 204A is wider than the bottom surface of the first conductive pillar 204A. In one embodiment, as shown in FIG. 2K, the top surface of a second conductive pillar 204B is wider than the bottom surface of the second conductive pillar 204B.

Figure 2L:
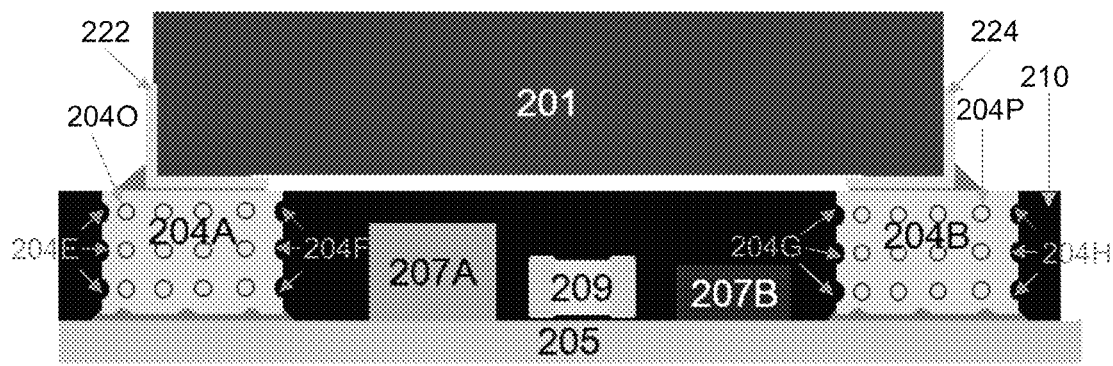

In one embodiment, as shown in FIG. 2L, at least one first recess 204E is formed on a first lateral surface of the first conductive pillar 204A and at least one cavity 2040 is formed on a second lateral surface of the first conductive pillar 204A. In one embodiment, as shown in FIG. 2L, at least one second recess 204F is formed on a third lateral surface of the first conductive pillar 204A. In one embodiment, at least one third recess 204G is formed on a first lateral surface of a second conductive pillar 204B and at least one cavity 204P is formed on a second lateral surface of the second conductive pillar 204B. In one embodiment, at least one fourth recess 204H is formed on a third lateral surface of the second conductive pillar 204B.

Figure 2M:
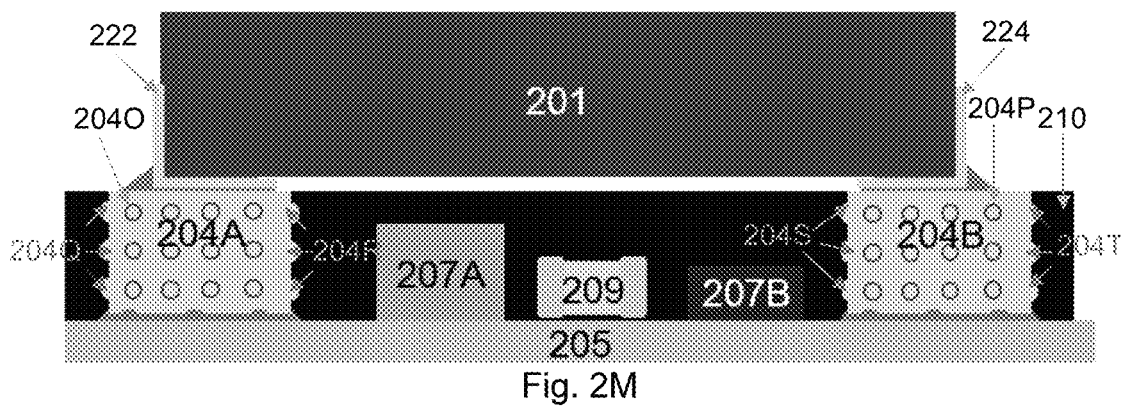

In one embodiment, as shown in FIG. 2M, at least one first protrusion 204Q is formed on a first lateral surface of the first conductive pillar 204A and at least one cavity 2040 is formed on a second lateral surface of the first conductive pillar 204A. In one embodiment, as shown in FIG. 2M, at least one second protrusion 204R is formed on a third lateral surface of the first conductive pillar 204A. In one embodiment, at least one third protrusion 204S is formed in a first lateral surface of a second conductive pillar 204B and at least one cavity 204P is formed on a second lateral surface of the second conductive pillar 204B. In one embodiment, at least one fourth protrusion 204T is formed in a third lateral surface of the second conductive pillar 204B.

Figure 2N:
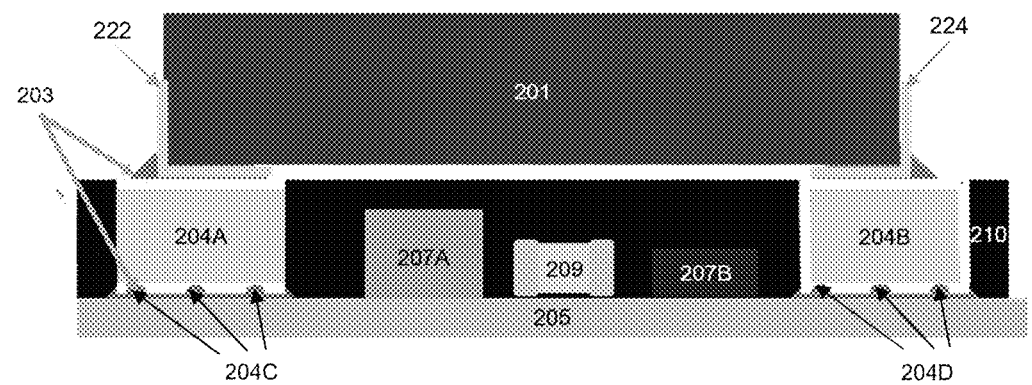

In one embodiment, as shown in FIG. 2N, a plurality of cavity 204C are formed in a first lateral surface of the first conductive pillar 204A. In one embodiment, a plurality of cavity 204D are formed in a first lateral surface of the second conductive pillar 204B.

In addition to the square body, the shape of the copper pillar can also be a rectangular parallelepiped, a trapezoid, wherein at least one recess, which can be a groove, can be formed on the bottom surface of the copper pillar to help the venting of the soldering material as well as to increase the soldering area. Furthermore, the protrusion can be formed on lateral surfaces of the copper pillar to improve the adhesion between the Epoxy of the molding body and the copper pillar. The copper pillar can increase the conductivity and good for heat dissipation so as to avoid the increase in temperature and electromigration (Kirkendall void).

Figure 2O:
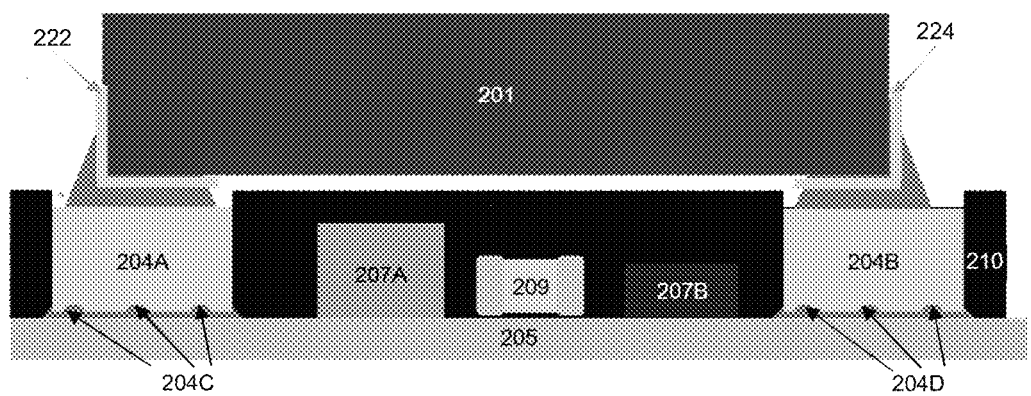

In one embodiment, as shown in FIG. 2O, each of the first conductive pillar 204A and the second conductive pillar 204B comprises copper pillar and at least one another metal layer, such as tin or gold, that encapsulates the copper pillar 204A, 204B, wherein at least one recess, which can be a groove, is formed in the at least one another metal.

Figure 2P:
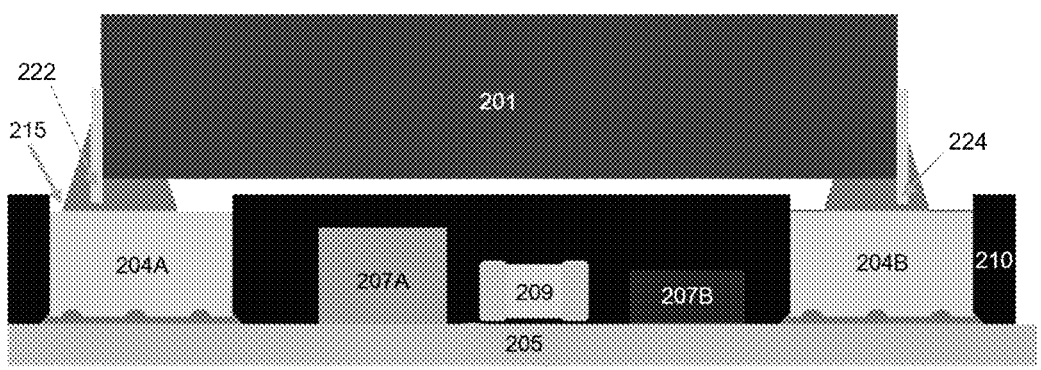

In one embodiment, as shown in FIG. 2P, a top surface of the first conductive pillar is lower than that of the molding body 210 so that a third recess 215 is formed on the top surface of the first conductive pillar 204A with two sidewalls of the molding body 210, wherein the soldering material 203 is filled into said third recess 215, for preventing the soldering material 203 from breaking. In one embodiment, each of the electrodes 222, 224 is disposed on a side surface of the magnetic device 201 and extended across the bottom surface of the magnetic device 201 for electrically connecting with a corresponding one of the conductive pillars 204A, 204B.

Figure 2Q:
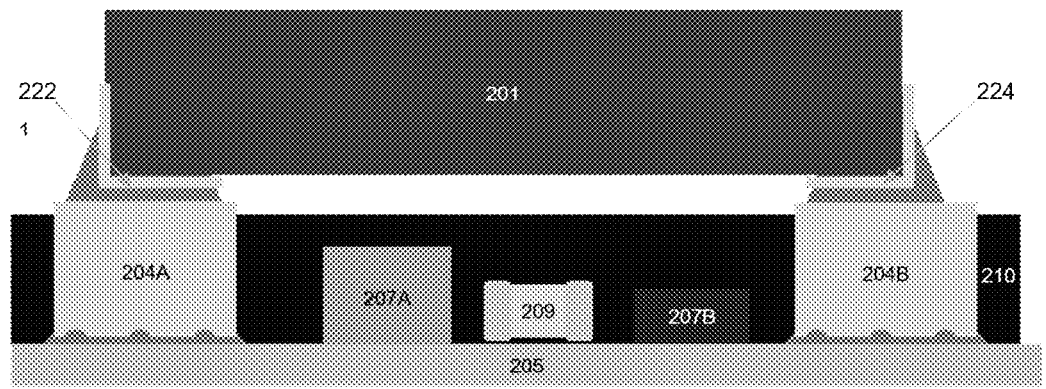

In one embodiment, as shown in FIG. 2Q, a top surface of the first conductive pillar 204A is higher than that of the molding body 210, wherein the soldering material 203 is disposed on the top surface of the first conductive pillar 204A for preventing the soldering material 203 from breaking.

Figure 3:
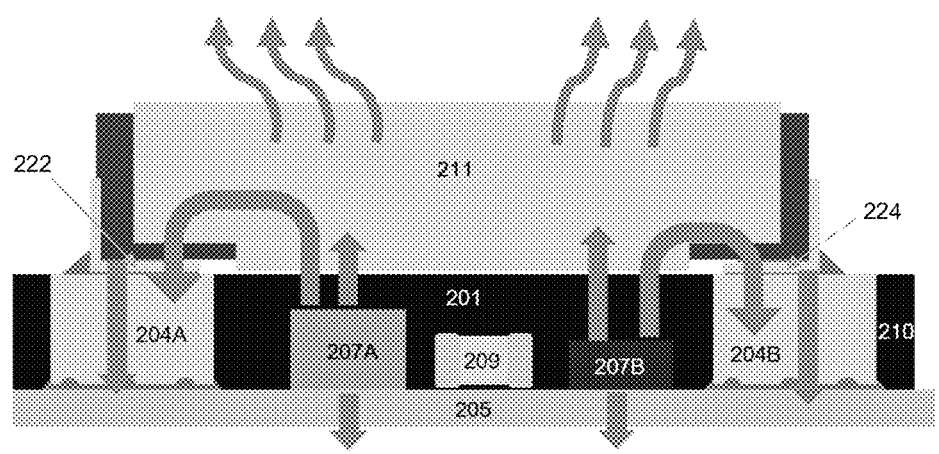
FIG. 3 is a partially schematic, cross-sectional side view of a stacked electronic structure in accordance with another embodiment of the invention.

In one embodiment, as shown in FIG. 3, a first metal layer 211 encapsulates a top surface and a plurality of side surfaces of the magnetic device 201 for heat dissipation.

In one embodiment, as shown in FIG. 3, a first metal layer 211 encapsulates a top surface and a plurality of side surfaces of the magnetic device 201 for heat dissipation and reducing EMI, wherein the first metal layer 211 is connected to a ground.

In one embodiment, the first metal layer 211 is a folded metal plate that encapsulates the top surface and the plurality of side surfaces of the magnetic device.

In one embodiment, the first metal layer 211 is electroplated on the top surface and the plurality of side surfaces of the magnetic device.

In one embodiment, the magnetic device 201 is an inductor, which can be a choke, and the first metal layer 211 is a folded metal plate that encapsulates the top surface and the plurality of side surfaces of the inductor.

In one embodiment, the magnetic device is an inductor, and the first metal layer 211 is electroplated on the top surface and the plurality of side surfaces of the inductor.

In one embodiment, another heat sink is disposed on the first metal layer 211.

Figure 4:
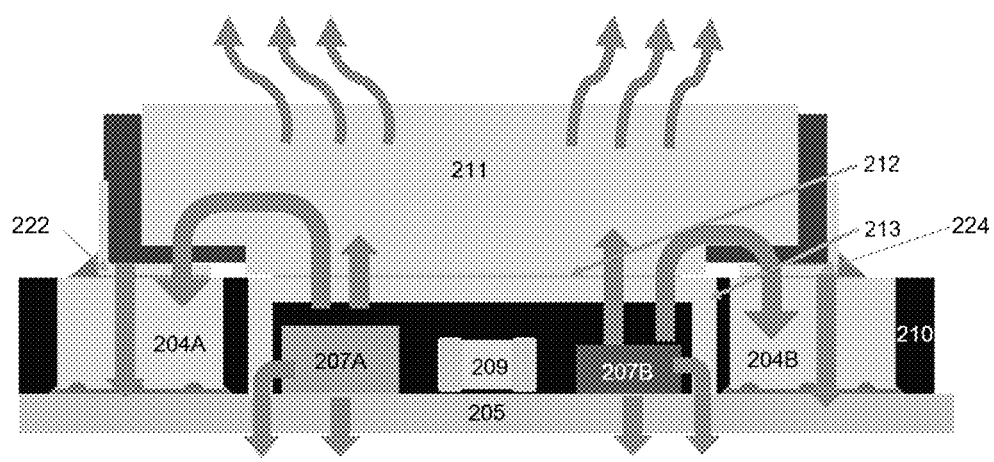
FIG. 4 is a partially schematic, cross-sectional side view of a stacked electronic structure in accordance with another embodiment of the invention.

In one embodiment, as shown in FIG. 4, a second metal layer 213 encapsulates the plurality of electronic devices 207A, 207B, 209 for heat dissipation.

In one embodiment, as shown in FIG. 4, a second metal layer 213 encapsulates the plurality of electronic devices 207A, 207B, 209 for heat dissipation and reducing EMI, wherein the second metal layer 213 is electrically connected to a ground.

In one embodiment, as shown in FIG. 4, a second metal layer 213 encapsulates the plurality of electronic devices 207A, 207B, 209, wherein the molding body 210 further encapsulates the plurality of conductive pillars 204A, 204B and the second metal layer 211 with a top surface of the second metal layer 211 exposed from the molding body 210, wherein a top surface of each of the conductive pillars 204A, 204B and a top surface of the second metal layer 213 are exposed from the top surface of the molding body 210.

In one embodiment, the second metal layer 213 is a folded metal plate that covers a top surface and side surfaces of the plurality of electronic devices 207A, 207B, 209.

In one embodiment, the second metal layer 213 is a folded metal plate that covers a top surface and side surfaces of the plurality of electronic devices 207A, 207B, 209, wherein at least one portion of the molding body 210 is disposed between the second metal layer 213 and the plurality of electronic devices 207A, 207B, 209.

In one embodiment, as shown in FIG. 4, a bottom surface of the first metal layer 211 and a top surface of the second metal layer 213 are joint by a soldering material or a conductive and adhesive material 212.

Figure 5A:
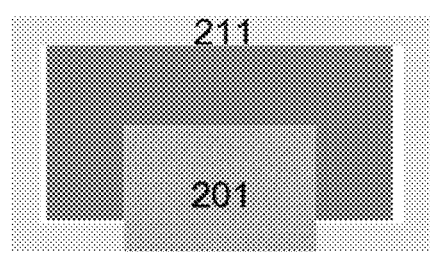
FIG. 5A-5P shows different shapes of the first metal layer that encapsulates the magnetic device of the stacked electronic module.
Figure 5B:
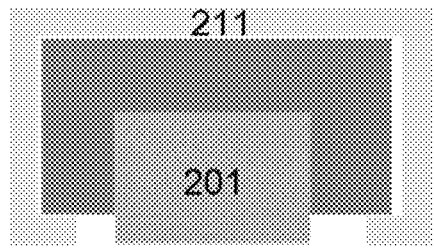
Figure 5C:
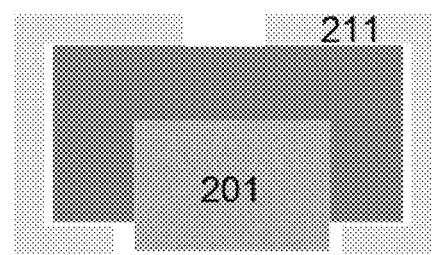
Figure 5D:
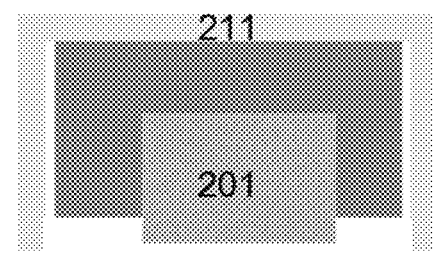
Figure 5E:
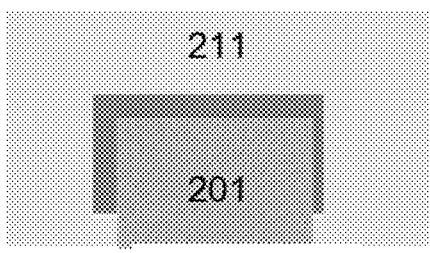
Figure 5F:
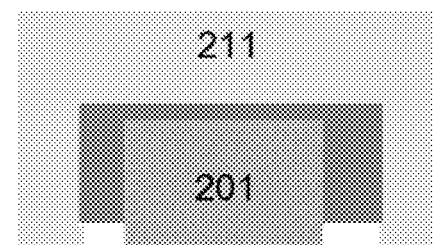
Figure 5G:
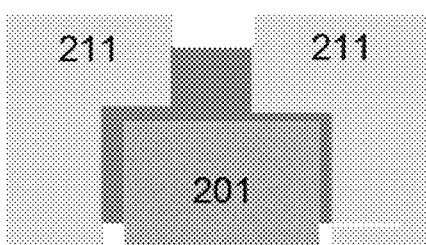
Figure 5H:
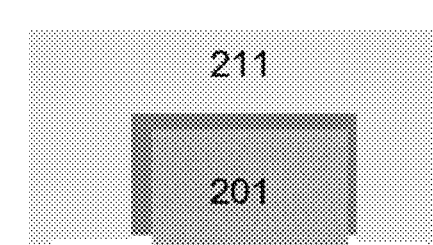
Figure 5I:
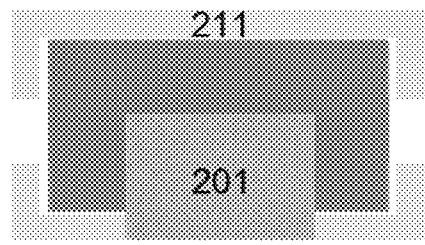
Figure 5J:
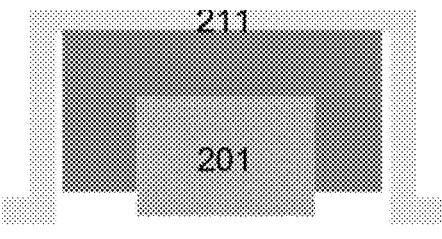
Figure 5K:
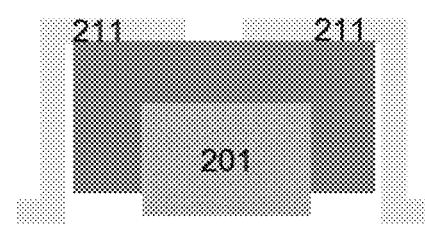
Figure 5L:
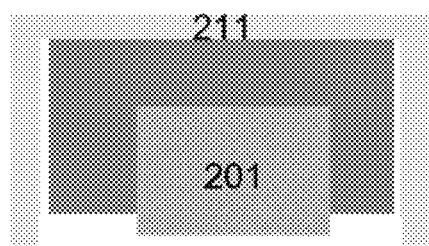
Figure 5M:
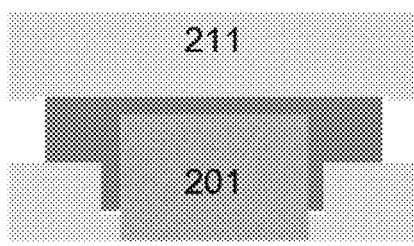
Figure 5N:
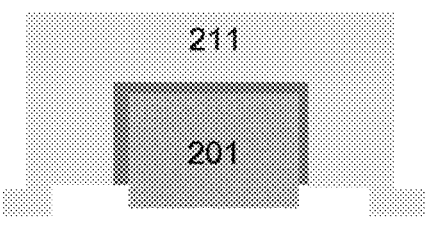
Figure 5O:
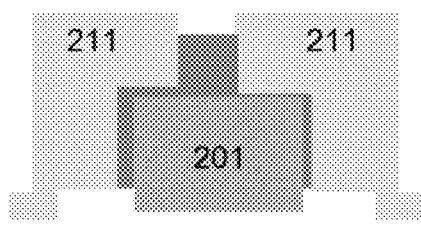
Figure 5P:
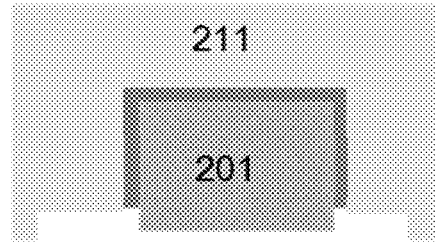

FIG. 5A-5P shows different shapes of the first metal layer 211 that can encapsulate a top surface and a plurality of side surfaces of the magnetic device 201, or the first metal layer 211 can encapsulate a top surface, a bottom surface and a plurality of side surfaces of the magnetic device 201 such as an inductor, for heat dissipation and reducing EMI, wherein the first metal layer 211 is electrically connected to a ground.

Figure 6A:
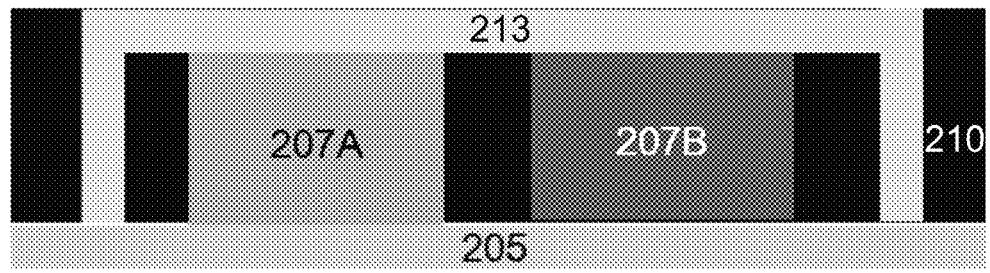
FIG. 6A-6P shows different shapes of the second metal layer that encapsulates the plurality of electronic devices of the stacked electronic module.
Figure 6B:
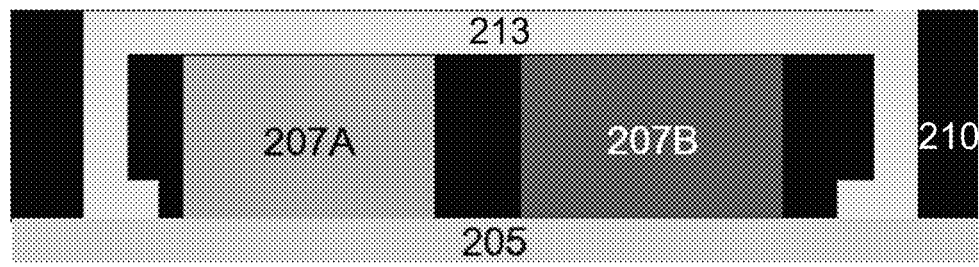
Figure 6C:
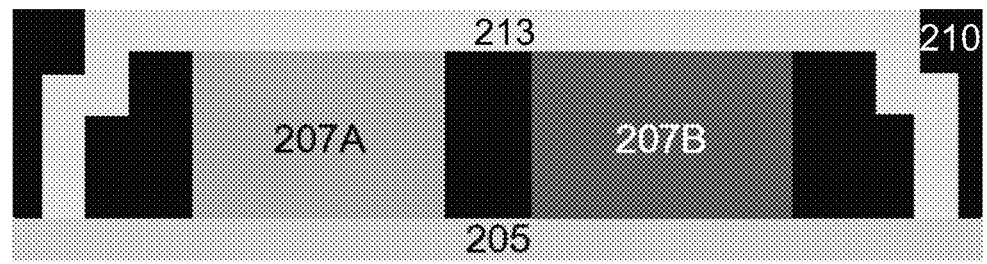
Figure 6D:
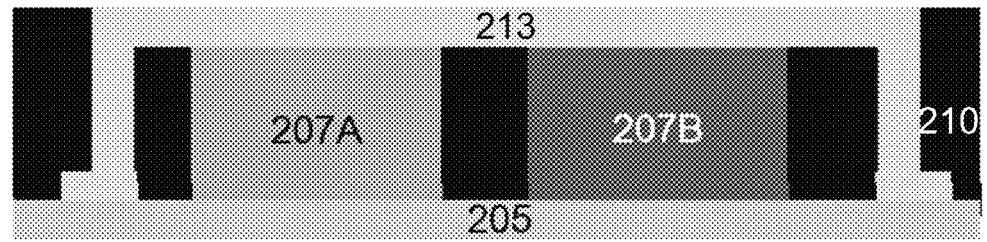
Figure 6E:
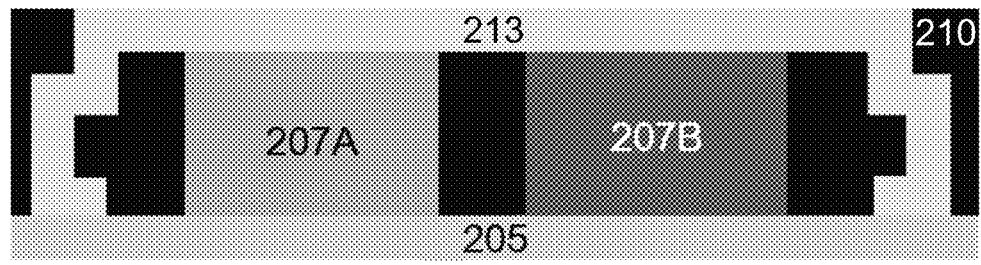
Figure 6F:
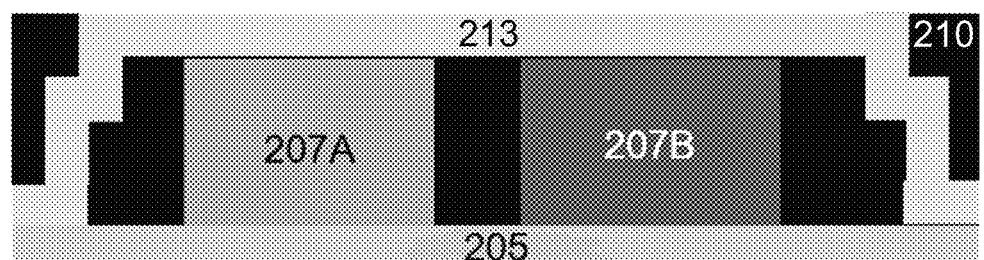
Figure 6G:
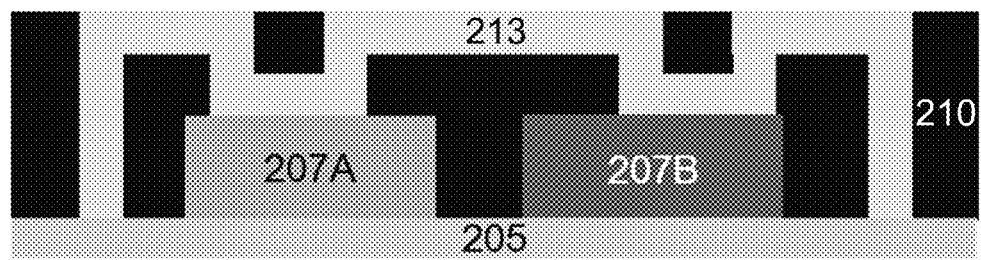
Figure 6H:
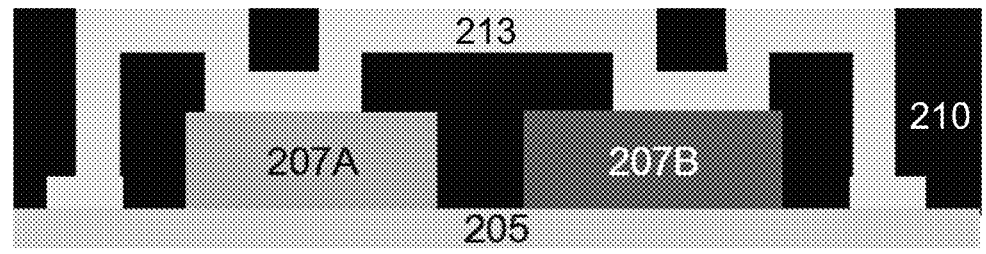
Figure 6I:
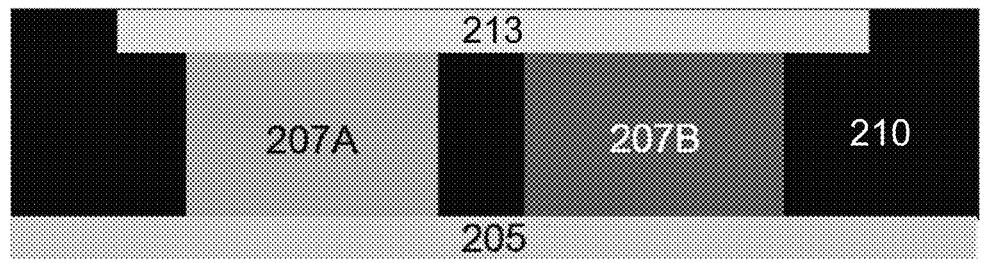
Figure 6J:
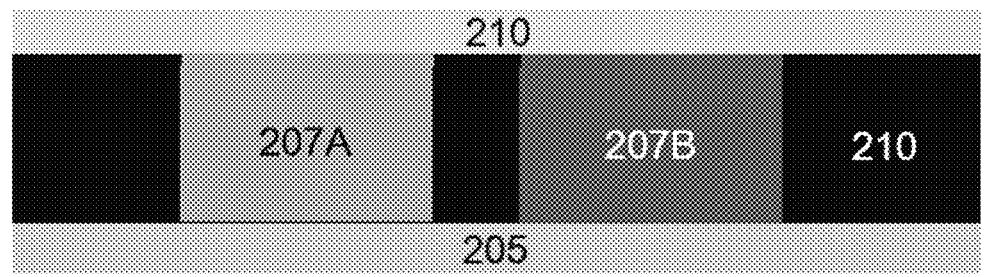
Figure 6K:
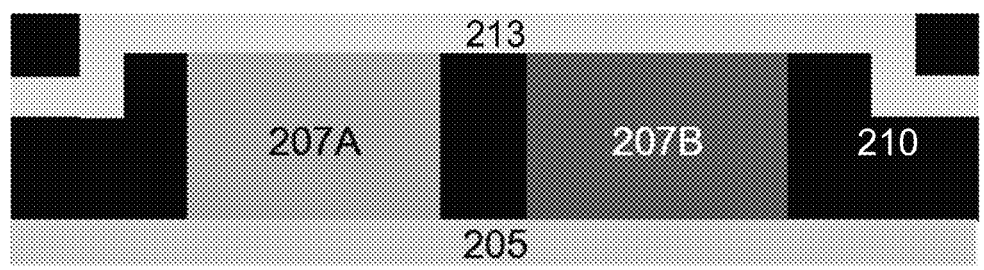
Figure 6L:
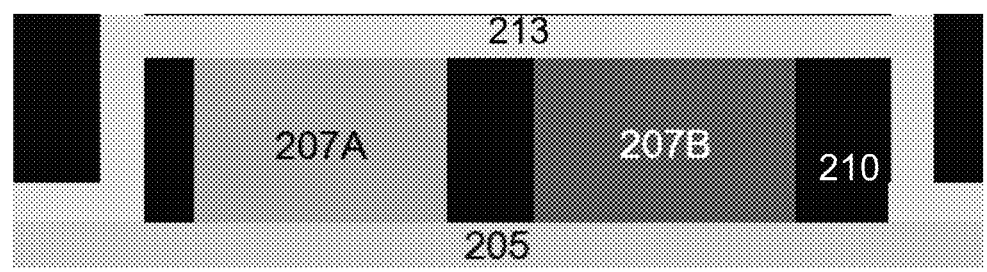
Figure 6M:
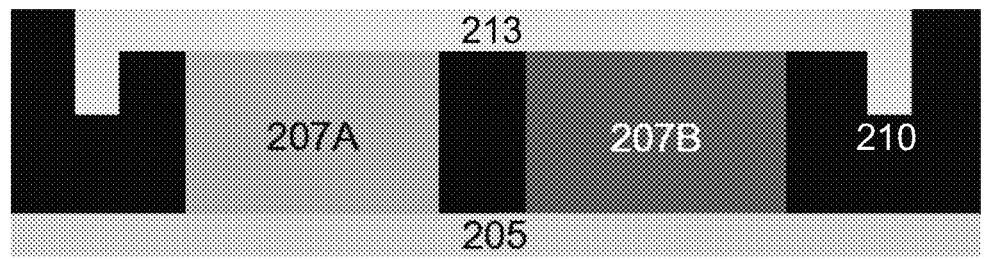
Figure 6N:
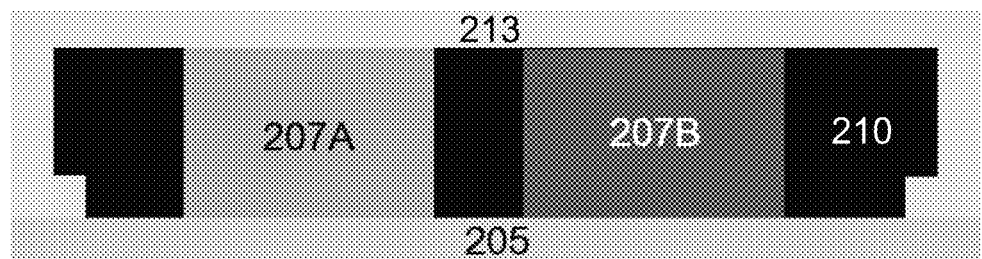
Figure 6O:
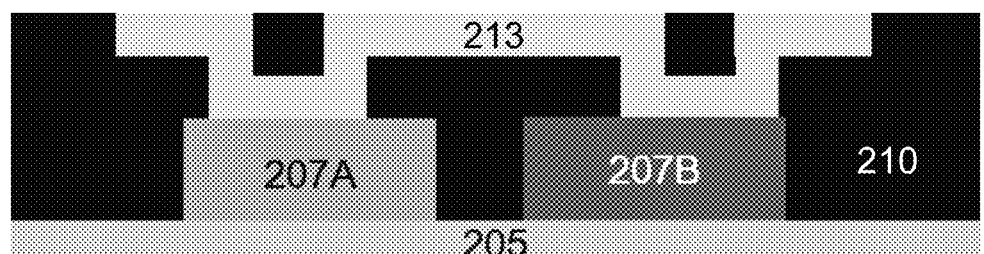
Figure 6P:
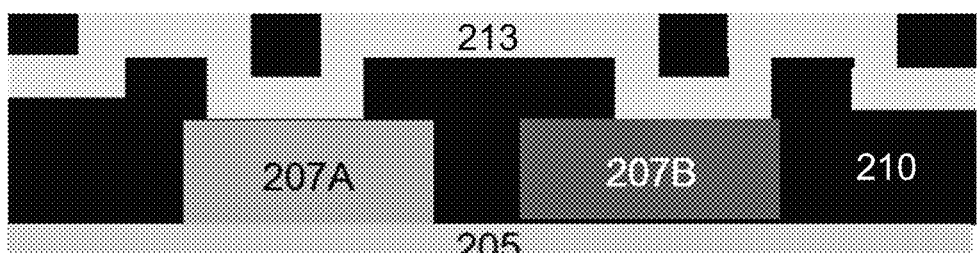

FIG. 6A-6P shows different shapes of the second metal layer 213 that can encapsulate the plurality of electronic devices 207A, 207B, 209 for heat dissipation and reducing EMI, wherein the second metal layer 213 is electrically connected to a ground.

Figure 7A:
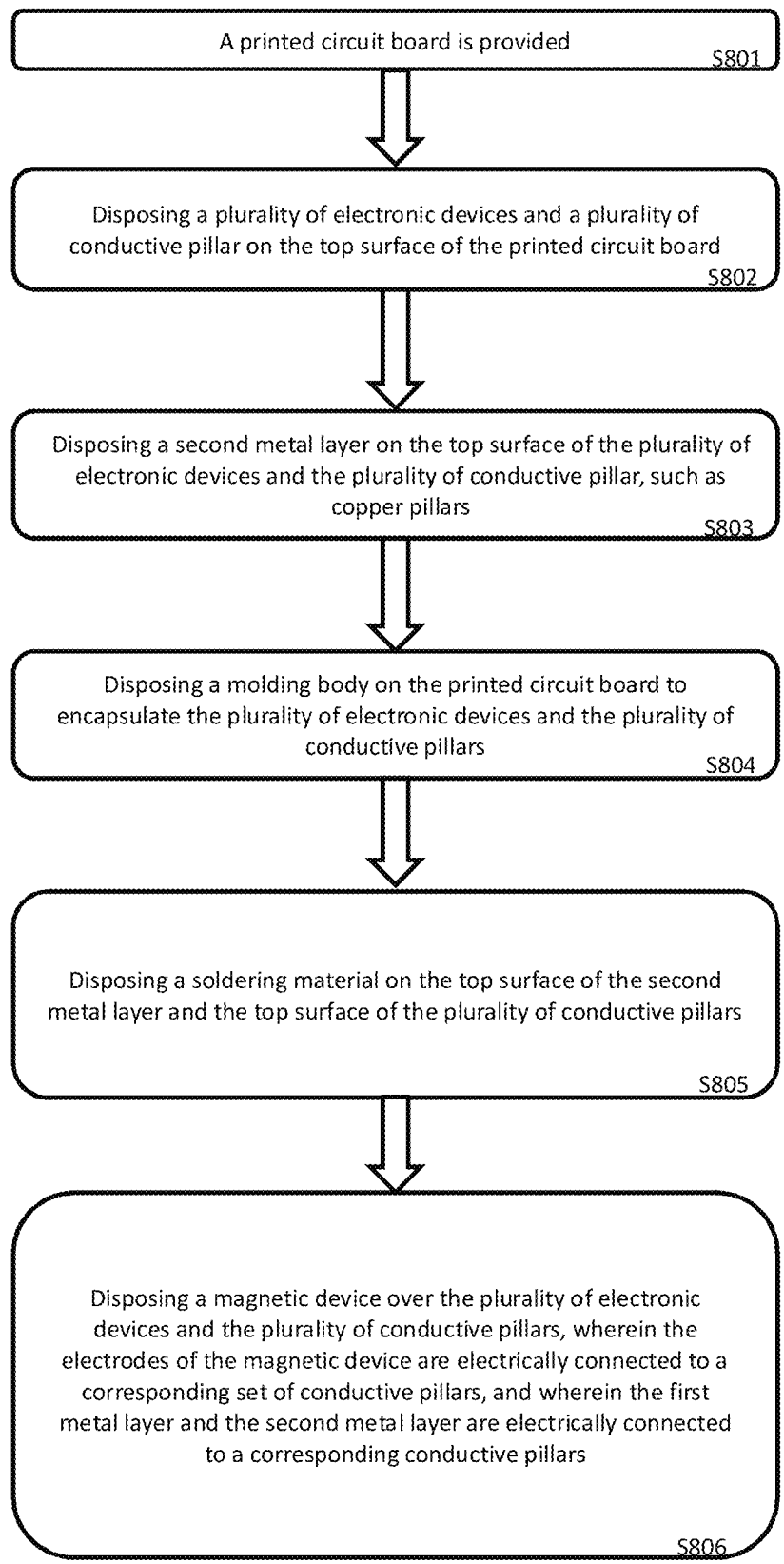
FIG. 7A shows a process to make the stacked electronic module.
Figure 7B:
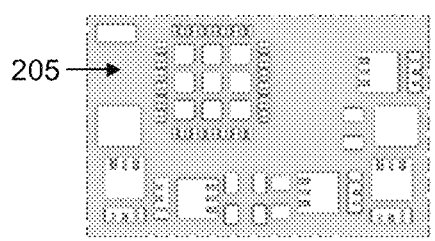
FIG. 7B-7G shows the corresponding structure of the stacked electronic module of each step in FIG. 7A.
Figure 7C:
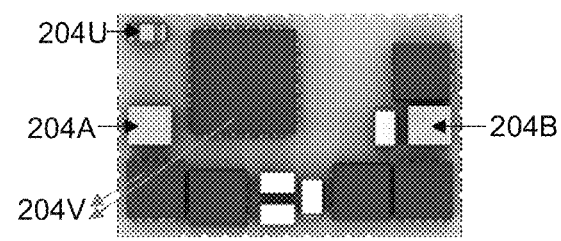
Figure 7D:
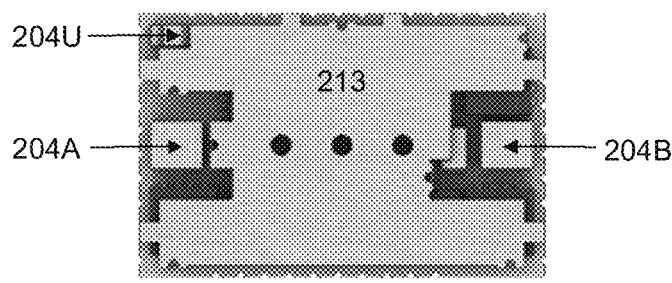
Figure 7E:
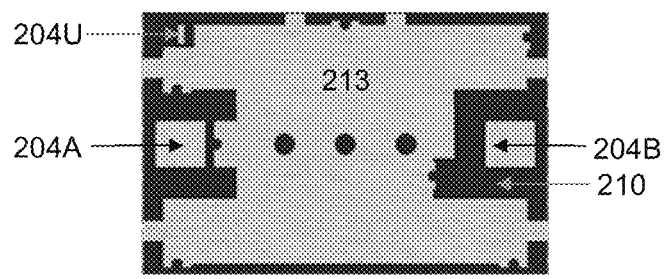
Figure 7F:
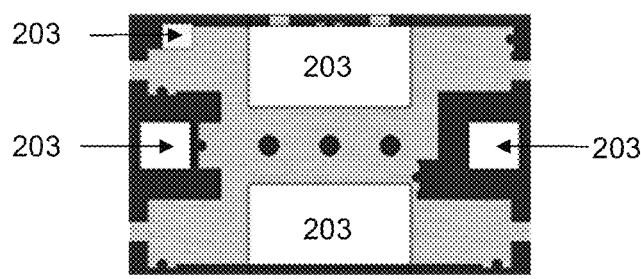
Figure 7G:
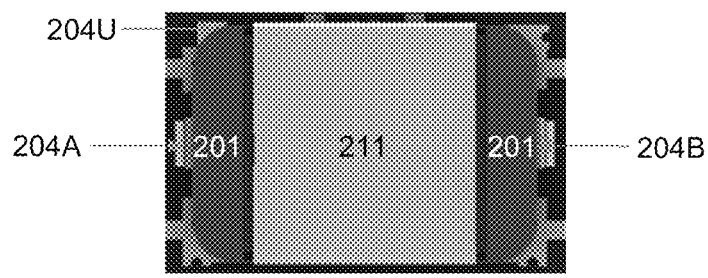

FIG. 7A shows a process to make the stacked electronic module and FIG. 7B-7G respectively show a corresponding structure of each step in FIG. 7A. Please refer to FIG. 7A-7G In step S801, a printed circuit board 205 is provided as shown in FIG. 7B. In step S802, a plurality of electronic devices 204V and a plurality of conductive pillar 204A, 204B, 204U are disposed on the top surface of the printed circuit board, as shown in FIG. 7C. In step S803, a second metal layer 213, such as a metal plate, is disposed on the top surface of the plurality of electronic devices 204V and the plurality of conductive pillar 204A, 204B, 204U, as shown in FIG. 7D. In step S804, a molding body 210 is disposed on the printed circuit board 205 to encapsulate the plurality of electronic devices 204V and the plurality of conductive pillar 204A, 204B, 204U, as shown in FIG. 7E. In step S805, a soldering material 203 is disposed on the top surface of the second metal layer 213 and the top surface of the plurality of conductive pillars 204A, 204B, 204U, wherein the conductive pillar 204U is electrically connected to the first metal layer 213 by the soldering material 203, as shown in FIG. 7F. In step S806, a magnetic device 201, such as an inductor, is disposed over the plurality of electronic devices 204V and the plurality of conductive pillar 204A, 204B, 204U, wherein a first metal layer 211, such as a metal plate, is disposed on the top surface of the magnetic device 201, wherein the electrodes of the magnetic device 201 are electrically connected to a corresponding set of conductive pillars 204A, 204B, and the first metal layer 211 and the second metal layer 213 are electrically connected to the conductive pillar 204U by the soldering material 203, as shown in FIG. 7G.

Figure 8A:
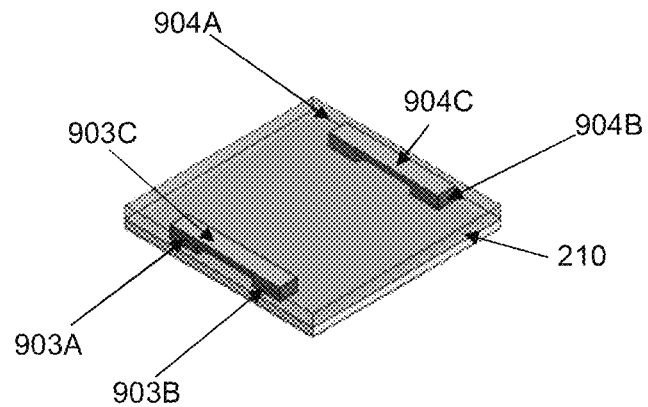
FIG. 8A-8B shows another structure of the conductive pillars of the stacked electronic module.
Figure 8B:
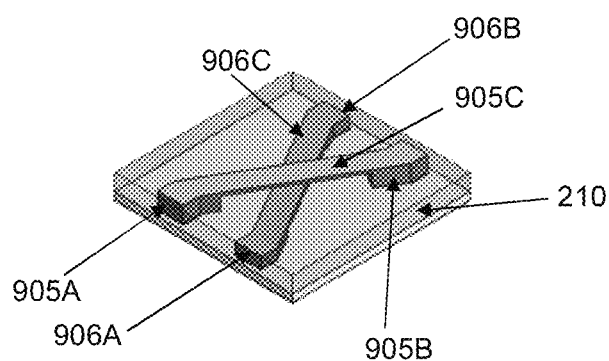

As shown in FIG. 8A or FIG. 8B, the plurality of the conductive pillars can also be connected in different ways for supporting the magnetic device disposed over the plurality of the conductive pillars. As shown in FIG. 8A, a pillar structure is made by connecting two conductive pillar 903A, 903B by a metal strip 903C along a same edge of the molding body 210, and another pillar structure is made by connecting another two conductive pillars 904A, 904B by a metal strip 904C along another same edge of the molding body 210. As shown in FIG. 8B, a pillar structure is made by connecting two conductive pillar 905A, 905B at two opposite edges of the molding body 210 by a metal strip 905C, and another pillar structure is made by connecting another two conductive pillar 906A, 906B at two opposite edges of the molding body 210 by a metal strip 906C. In addition, when the magnetic device 211 contains two inductors or chokes that need to be connected, then the connection between the electrodes of the two inductors or chokes can be established by connecting the corresponding conductive pillars as shown in FIG. 8A or FIG. 8B as well, wherein the two electrodes of each inductor or choke are respectively disposed over two corresponding conductive pillars. The above-mentioned conductive pillar can comprise copper or be made of copper.

In various embodiments of the invention, at least one recess, which can be a groove, can be formed on the bottom surface of the copper pillar to help the venting of the soldering material as well as to increase the soldering area. Furthermore, recesses, which can be grooves, cavities and protrusions can be formed on lateral surfaces of the conductive pillar such as copper pillar to improve the adhesion between the Epoxy of the molding body and the copper pillar. The conductive pillar such as copper pillar can increase the conductivity and good for heat dissipation so as to avoid the increase in temperature and electromigration (Kirkendall void). Furthermore, metal layers such as copper plates can be used to encapsulate the plurality of electronic devices and the magnetic device such as an inductor for heat dissipation as well as reducing EMI.

From the foregoing, it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:
1. A stacked electronic structure, comprising:
   a substrate, wherein a plurality of electronic devices and a plurality of conductive pillars are disposed on and electrically connected to the substrate, wherein a molding body encapsulates the plurality of electronic devices, wherein at least one first recess is formed on a bottom surface of a first conductive pillar of the plurality of conductive pillars, and a soldering material is disposed on a top surface of the substrate and filled into said at least one first recess, and wherein at least one second recess is formed on a bottom surface of a second conductive pillar of the plurality of conductive pillars, and a soldering material is disposed on a top surface of the substrate and filled into said at least one second recess; and a magnetic device, disposed over a top surface of the molding body and the plurality of conductive pillars, wherein a first electrode of the magnetic device is disposed over and electrically connected to the first conductive pillar and a second electrode of the magnetic device is disposed over and electrically connected to the second conductive pillar.

2. The stacked electronic structure as claimed in claim 1, wherein each of the first conductive pillar and the second conductive pillar is made of metal.

3. The stacked electronic structure as claimed in claim 1, wherein each of the first conductive pillar and the second conductive pillar comprises a copper pillar.

4. The stacked electronic structure as claimed in claim 1, wherein a first plurality of recesses are formed on the bottom surface of the first conductive pillar, and the soldering material is disposed on the top surface of the substrate and filled into the first plurality of recesses, and wherein a second plurality of recesses are formed on the bottom surface of the second conductive pillar, and the soldering material is disposed on the top surface of the substrate and filled into the second plurality of recesses.

5. The stacked electronic structure as claimed in claim 1, wherein the magnetic device is an inductor.

6. The stacked electronic structure as claimed in claim 5, wherein the inductor comprises a magnetic body and a coil disposed in the magnetic body, wherein a first lead of the inductor is disposed on the magnetic body and electrically connected to the coil, wherein the first lead comprises a first portion disposed on a top surface of the magnetic body and a second portion extended disposed on a lateral surface of the magnetic body.

7. The stacked electronic structure as claimed in claim 1, wherein the plurality of electronic devices comprise an IC and a MOSFET.

8. The stacked electronic structure as claimed in claim 1, wherein the molding body further encapsulates the plurality of conductive pillars with a top surface of each of the conductive pillars exposed from the molding body.

9. The stacked electronic structure as claimed in claim 1, wherein a first metal layer encapsulates the plurality of electronic devices, wherein the molding body encapsulates the plurality of conductive pillars and the first metal layer, wherein a top surface of each of the conductive pillars and a top surface of the first metal layer are exposed from the top surface of the molding body.

10. The stacked electronic structure as claimed in claim 9, wherein a second metal layer encapsulates a top surface and a plurality of side surfaces of the magnetic device.

11. The stacked electronic structure as claimed in claim 10, wherein the first metal layer and the second metal layer are joint by a soldering material.

12. The stacked electronic structure as claimed in claim 11, wherein the first metal layer is electrically connected to a third conductive pillar.

13. The stacked electronic structure as claimed in claim 8, wherein a top surface of the first conductive pillar is lower than that of the molding body to form a third recess on the top surface of the first conductive pillar with two sidewalls of the molding body, wherein a soldering material is filled into the third recess.

14. The stacked electronic structure as claimed in claim 8, wherein a top surface of the first conductive pillar is higher than that of the molding body.

15. The stacked electronic structure as claimed in claim 1, wherein the substrate is a PCB, BT (Bismaleimide Triazine) board, metallic substrate or ceramic substrate.

16. The stacked electronic structure as claimed in claim 1, wherein each of the first conductive pillar and the second conductive pillar comprises a copper pillar and at least one metal layer encapsulating the copper pillar.

17. The stacked electronic structure as claimed in claim 1, wherein at least one recess or cavity is formed on a first lateral surface of the first conductive pillar.

18. The stacked electronic structure as claimed in claim 1, wherein at least one protrusion is formed on a first lateral surface of the first conductive pillar.

19. A stacked electronic structure, comprising:
a substrate, wherein a plurality of electronic devices and a plurality of conductive pillars are disposed on and electrically connected to the substrate, wherein a molding body encapsulates the plurality of electronic devices, wherein a first metal layer encapsulates the plurality of electronic devices, wherein a molding body encapsulates the plurality of conductive pillars and the first metal layer, wherein a top surface of each of the conductive pillars and a top surface of the first metal layer are exposed from a top surface of the molding body; and a magnetic device, disposed over the molding body, the metal layer and the plurality of conductive pillars, wherein a first electrode of the magnetic device is disposed over and electrically connected to a first conductive pillar and a second electrode of the magnetic device is disposed over and electrically connected to a second conductive pillar, wherein a second metal layer encapsulates a top surface and a plurality of side surfaces of the magnetic device, and the second metal layer is disposed over and electrically connected to the first metal layer.

20. A stacked electronic structure, comprising:
a substrate, wherein a plurality of electronic devices and a plurality of conductive pillars are disposed on and electrically connected to the substrate, wherein a molding body encapsulates the plurality of electronic devices, wherein a metal layer encapsulates the plurality of electronic devices, wherein the molding body encapsulates the plurality of conductive pillars and the metal layer, wherein a top surface of each of the conductive pillars and a top surface of the metal layer are exposed from a top surface of the molding body; and a magnetic device, disposed over the molding body, the metal layer and the plurality of conductive pillars, wherein a first electrode of the magnetic device is disposed over and electrically connected to a first conductive pillar and a second electrode of the magnetic device is disposed over and electrically connected to a second conductive pillar, and wherein the metal layer is electrically connected to a third conductive pillar.

* * * * *